(12) United States Patent
Gao et al.

(10) Patent No.: US 10,764,980 B2
(45) Date of Patent: *Sep. 1, 2020

(54) LED LIGHT APPARATUS

(71) Applicant: XIAMEN ECO LIGHTING CO. LTD., Xiamen (CN)

(72) Inventors: yan zeng Gao, Xiamen (CN); hong kui Jiang, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/296,204

(22) Filed: Mar. 7, 2019

(65) Prior Publication Data

US 2020/0236750 A1   Jul. 23, 2020

Related U.S. Application Data

(60) Provisional application No. 62/793,847, filed on Jan. 17, 2019.

(51) Int. Cl.
| | |
|---|---|
| *H05B 45/20* | (2020.01) |
| *H05B 33/08* | (2020.01) |
| *H05B 33/06* | (2006.01) |
| *H01L 33/50* | (2010.01) |
| *H05B 45/00* | (2020.01) |
| *H05B 47/19* | (2020.01) |

(52) U.S. Cl.
CPC ............ *H05B 45/20* (2020.01); *H01L 33/50* (2013.01); *H05B 33/06* (2013.01); *H05B 45/00* (2020.01); *H05B 47/19* (2020.01)

(58) Field of Classification Search
CPC   H05B 33/0857; H05B 33/06; H05B 33/0806; H05B 37/0272; H01L 33/50
See application file for complete search history.

(56) References Cited

U.S. PATENT DOCUMENTS

| | | | | |
|---|---|---|---|---|
| 8,449,129 | B2 * | 5/2013 | Harbers | H05B 33/0803 362/84 |
| 10,197,224 | B1 * | 2/2019 | Macias | F21K 9/278 |
| 10,321,541 | B2 * | 6/2019 | Bora | H05B 33/0842 |
| 2006/0214578 | A1 * | 9/2006 | Iwanaga | C09K 11/7731 313/512 |
| 2012/0287624 | A1 * | 11/2012 | Harbers | F21V 7/0008 362/231 |
| 2013/0301257 | A1 * | 11/2013 | Britt | H01L 25/0753 362/231 |
| 2018/0038581 | A1 * | 2/2018 | Nolan | F21S 41/192 |
| 2018/0317306 | A1 * | 11/2018 | Harris | H05B 37/0254 |

* cited by examiner

*Primary Examiner* — Henry Luong
(74) *Attorney, Agent, or Firm* — Chun-Ming Shih; Lanway IPR Services

(57) ABSTRACT

A light apparatus for generating a mixed light output. The light apparatus includes multiple LED modules. Each LED module includes multiple LED regions. The multiple LED regions cover a single LED chip. The multiple LED regions share the same package for emitting lights with different optical characteristics.

18 Claims, 15 Drawing Sheets

LED LIGHT APPARATUS

RELATED APPLICATION

This application claims priority of a provisional application No. 62/793,847.

FIELD

The present invention is related to a light apparatus and more particularly related to a LED light apparatus with mixed light.

BACKGROUND

When the LED technology keeps advancing, more types of LED light devices are developed and designed. There is always a strong need to find a convenient, low cost and flexible light apparatus for improving human life.

SUMMARY OF INVENTION

There are multiple ways to implement the invention. In some embodiments, a light apparatus is designed for generating mixed light output. The light apparatus includes multiple LED modules, a control circuit, and a driver module.

Each LED module includes a package housing for multiple LED regions. The multiple LED regions have separate electrodes. The multiple LED regions share the package housing but are covered with different fluorescent layers for emitting lights with different optical characteristics.

The control circuit is used for determining currents supplied to the LED regions separately for generating a mixed light output with requested optical parameters.

The driver module is electrically connected to the electrodes of the multiple LED regions and connected to the control circuit for selectively supplying the currents to multiple LED regions of the multiple LED modules.

In some embodiments, the multiple LED regions include a blue light region, a red light region, a green light region and a white light region.

In some embodiments, the multiple LED regions emit lights with different color temperatures. The multiple LED regions emit lights with different color spectrums.

In some embodiments, the multiple LED regions in the LED module are arranged as grids.

In some embodiments, the different LED regions include the same LED chips covered with different first fluorescent layers and a same second fluorescent layer.

In some embodiments, the first fluorescent layers have less area than the second fluorescent layer.

In some embodiments, the second fluorescent layer comprise multiple sub-layers stacked one above another.

In some embodiments, the multiple LED regions contain different LED chips.

In some embodiments, the different LED chips are kept with a distance for better heat dissipation.

In some embodiments, at least two of the multiple LED regions are covered with the same fluorescent layer.

Some other features may use the features further mentioned below.

In some embodiments, a light apparatus is designed for generating mixed light output. The light apparatus includes multiple LED modules, a control circuit, and a driver module.

Each LED module includes multiple LED regions. The multiple LED regions have separate electrodes. The multiple LED regions share multiple stacked semiconductor layers but at least two LED regions have different etched trench patterns for emitting lights with different optical characteristics.

The control circuit determines currents supplied to the LED regions separately for generating a mixed light output with requested optical parameters. For example, the control circuit may be connected to an operative switch for receiving a user input or a pre-defined setting.

The driver module is electrically connected to the electrodes of the multiple LED regions and connected to the control circuit for selectively supplying the currents to multiple LED regions of the multiple LED modules. PWM or linear currents may be supplied to the LED regions to generate different light strengths.

In some embodiments, the multiple LED regions may include a blue light region, a red light region, a green light region and a white light region. With the four light regions, a mixed light is generated by adjusting currents supplied to the four regions. In some other embodiments, the currents may be fixed, instead of being changed dynamically.

In some embodiments, the multiple LED regions emit lights with different color temperatures. By adjusting different current ratios or different PWM duty ratios, the LED module may emit lights of different color temperatures.

In some embodiments, the multiple LED regions emit lights with different color spectrums. For example, different LED regions may emit different colors.

In some embodiments, the multiple LED regions in the LED module are arranged as grids. For example, each LED region is a rectangular area and arranged together as a larger rectangular shape.

In some embodiments, the shared stacked semiconductor layers include a GaN buffer layer, a N-type GaN layer, a InGaN/GaN layer, an electronic shielding layer, and a P type GaN layer, from bottom to top.

In some embodiments, the etched trench patterns have different trench densities for generating output lights of different optical characteristics. By adjusting trench densities, different LED regions emit lights with different optical characteristics. Meanwhile, because the different LED regions may share the same substrate and stacked semiconductor layers, it is easier to manufacture the LED module in the same semiconductor procedure.

In some embodiments, the etched trench patterns are formed on a Lithium aluminate substrate.

In some embodiments, the LED regions are covered with one or more fluorescent layer to change output light characteristics.

In some embodiments, the fluorescent layers covering different LED regions are different for mixing different lights. In other words, different LED regions are covered with different fluorescent layers for further adjusting light outputs.

In some embodiments, the same LED regions in different LED modules are supplied with different current values. Specifically, there are multiple LED modules disposed in the same light apparatus. In such design, even the LED regions with the same etched trench pattern in different LED modules may be supplied with different current values, e.g. depending on where the LED module is disposed in the light apparatus.

In some embodiments, when an overall driving current is decreased, the currents supplied to different LED regions drop at different speeds. In other words, in such design, the overall light output strength may be adjusted by adjusting an overall current strength. When the overall light of the light apparatus is lowered down, the currents dropping speeds are controlled to be different, e.g. so as to simulate some natural light changes from noon to sunset.

In some embodiments, light emitted directions of the multiple LED regions are overlapped partially to generate a better mixed effect. For example, each LED regions are arranged with certain tilt angles in some layers or directed by some layers to overlap the lights from different LED regions.

In some embodiments, the etched trench patterns emit of the multiple LED regions are arranged with a tilt angles for overlapping emitted lights of the multiple LED regions.

In some embodiments, area sizes of the multiple LED regions are not the same. For example, some LED regions provide more lights than other LED regions when they are major light sources.

In some embodiments, at least two of the multiple LED regions have the same etched trench pattern. For example, there may be two red regions, one green region and one blue region for emphasizing certain light characteristic.

In some embodiments, the control circuit includes a communication circuit for receiving an external command. The control circuit decodes the external command and translates the external command to corresponding control signals to the driver module to generate associated currents.

In some embodiments, the communication circuit is a wireless circuit. Therefore, the external command may be sent from a mobile phone, a remote control or even a remote server.

In some embodiments, the multiple LED regions are not supplied the currents at the same time. In other words, they are supplied with currents sequentially. This may help simplify circuit design and/or maximize output strength of each LED region, e.g. to keep a current generator circuit of the driver module to generate a constant current supplying to the LED regions one after another in a sequence.

In some embodiments, the LED regions are supplied with the currents sequentially in an adjustable order over time to emit different mixed lights. For example, some LED regions may be supplied with more times in the order to emphasize its output compared with other LED regions.

In some embodiments, a light apparatus includes a white set of LED (Light Emitted Diode) modules and a non-white set of LED modules. The white set of LED modules may include two or more than two LED modules. Each LED module may have one or more than one LED component, e.g. a packaged LED IC covered with fluorescent layer for emitting a light when receiving a driving current. There are more than two types of LED modules that emit different white lights, e.g. with different color temperatures, in the white set of LED modules.

The non-white set of LED modules may include two or more than two LED modules. Each LED module may have one or more than one LED component, e.g. a packaged LED IC covered with fluorescent layer for emitting a light when receiving a driving current. There are more than two types of LED modules that emit different lights, e.g. with different colors, in the non-white set of LED modules.

For example, the white set of LED modules has a first LED module and a second LED module. The first LED module emits a first light with a first color temperature and the second LED module emits a second light with a second color temperature. The first color temperature is different from the second color temperature. For example, the first LED module may emit a light with similar spectrum as sunrise white light, and the second LED module may emit a light with similar spectrum as noon white light.

For example, the non-white set of LED modules includes a third LED module and a fourth LED module. The third LED module emits a third light with a third color and the fourth LED module emits a fourth light with a fourth color. The third color is different from the fourth color. There may be a fifth LED module so that the third LED module, the fourth LED module and the fifth LED module emit red color, blue color and green color, respectively. By adjusting light strengths of non-white set of LED modules, a desired color may be mixed.

The light apparatus also has a control circuit for indicating an operation mode selected from at least a first mode and a second mode. The control circuit, for example, may be a digital circuit or integrated with a mechanic device for storing a status. Users may adjust a manual switch, operate a remote control for setting or adjusting the control circuit for indicating a different operation mode that may be selected from a first mode, a second mode and/or other modes.

A driver module is connected to the control circuit for selectively supplying currents to the first LED module, the second LED module, the third LED module, and the fourth LED module according to the operation mode. The driver module may include a current source, a PWM power circuit or other driver circuit types, for converting 110V or 220V AC to corresponding DC currents supplying to drive the white set of LED modules and the non-white set of LED modules. There may be multiple sub-modules in the driver module respectively for each LED module or for the white set and the for the non-white set of LED modules, respectively.

In the first mode, the first LED module and the second LED module are activated and the third LED module and the fourth LED module are deactivated for mixing a first output light using the first LED module and the second LED module. For example, no current is supplied to the non-white set of LED modules in the first mode. The first LED module and the second LED module are supplied with different currents to obtain different first output lights with different color temperatures.

In the second mode, the first LED and the second LED module are deactivated and the third LED module and the fourth LED module are activated for mixing a second output light using the third LED module and the fourth LED module. For example, the first LED module and the second LED module are turned off. The third LED module, the fourth LED module and maybe other LED module in the non-white set of LED modules are turned on to mix a desired color.

In some embodiments, the first output light is adjusted to a different color temperature by adjusting light strengths of the first LED module and the second LED module.

In some embodiments, the different color temperature of the first output light is obtained by changing a first current ratio of currents supplying to the first LED module and the second LED module.

In some embodiments, the different color temperature of the first output light is obtained by changing duty ratios of the first LED module and the second LED light module. In PWM power supplying, there is a duty ratio, the turned-on to turned-off ratio in a quickly repeated cycle, in PWM current supply. By adjusting the duty ratio, the overall output light strength is obtained. By adjusting the relative duty ratio between the first LED module and the second LED module, a different color temperature may be mixed.

In some embodiments, the first LED module and the second LED module emit lights simulating black body radiation spectrums corresponding to different sun light times. Black body radiation spectrum is used in Physics, for indicating light characteristics similar to sun light features.

In some embodiments, the non-white set of LED modules also includes a fifth LED module. The third LED module emits a red light, the fourth LED module emits a green light and the fifth LED module emits a blue light. The second output light is adjusted to have different colors by changing a output ratio of the third LED module, the fourth LED module and the fifth LED module.

In some embodiments, there is a wireless circuit connected to the control circuit for choosing the operation mode from the first mode and the second mode. The wireless circuit may implement Wi-Fi, Bluetooth, or other wireless protocols for receiving and/or transmitting signals to an external device like a mobile phone or a remote control.

In some embodiments, the wireless circuit also receives an external command for adjusting the first output light and the second output light. The external command may indicate a desired color temperature, a desired color, or a overall light strength for a luminance level.

In some embodiments, there is a manual switch manually operated by a user for indicating the control circuit to choose the operation mode from the first mode and the second mode. For example, the manual switch may be installed on a wall, on a back side of the light apparatus, on a remote control or on other places for users to operate for setting the light apparatus. The manual switch may be a button, a rotating switch, a touch panel, a jumper switch or other forms. The control circuit may receive the status of the manual switch and translate the status to choose a corresponding operation mode or other parameters.

For example, a light bulb as an example may be disposed with a manual switch near its bulb cap. Users may buy the same light bulb but switch the manual switch to set the output light of the light bulb to a desired color temperature or a desired color. This may decrease the storage in the store and users may even change the setting when they want to do so. Such mechanism may also be applied to down light, panel light, spot light or other light devices.

In some embodiments, the manual switch is concealed from direct user touch after installation of the light apparatus.

In some embodiments, the driver circuit has a shared current circuit for supplying a driving current to either the white set of LED modules or the non-white set of LED modules. As mentioned above, since the white set of LED module and the non-white set of LED modules may be set not turning on at the same time, there may be a shared current source supplying a common current source either supplying to the white set of LED modules or the non-white set of LED modules. In other words, in such design, there may be two sets of LED modules, but there may be only one set of driver circuit. Since the cost of LED modules are decreasing, the overall value of such design keeps increasing.

In some embodiments, the shared circuit switches the driving current to either the white set of LED modules or the non-white set of LED modules based on the operation mode.

In some embodiments, the driver module adjusts the first output light by changing duty ratios of the first LED module and the second LED module via PWM power supplying.

In some embodiments, the driver module adjusts the second output light by changing current ratios of the third LED module and the fourth LED module.

In some embodiments, the driver module activates both the white set of LED modules and the non-white set of LED modules in a third mode for generating a third output light.

In some embodiments, the driver module activates both the white set of LED modules and the non-white set of LED modules in a third mode for generating a third output light.

In some embodiments, a mixed color of the third output light is changed by adjusting the non-white set of LED modules.

In some embodiments, a mixed color temperature of the third output light is changed by adjusting the white set of LED modules.

In some embodiments, the white set of LED modules and the non-white set of LED modules are placed in an alternating mixed manner. Specifically, there may be multiple LED modules in the white set of LED modules and the non-white set of LED modules. To mix a better output light, the multiple LED modules may be disposed in an alternating mixed manner, e.g. different types of LED modules are placed next to each other while the same types of LED modules are distributed evenly on a light source plate.

In addition, since the first mode and the second mode determine that the white set of LED modules and the non-white set of LED modules are not turned on at the same time, one LED module of the white set of LED modules may be placed adjacent to one LED module of the non-white set of LED modules for achieving better heat dissipation, i.e. heat not accumulated at the same place.

In some embodiments, the control circuit switches to the first mode or the second mode when the white set of LED modules or the non-white set of LED modules are damaged.

DETAILED DESCRIPTION

This invention implements following concept in various light bulbs, downlight light, spot lights, any luminous devices and/or electronic devices with light components. LED (Light Emitted Diode) modules, not limited, are preferred in following embodiments.

There are multiple ways to implement the invention.

There are multiple ways to implement the invention. In some embodiments, a light apparatus is designed for generating mixed light output. The light apparatus includes multiple LED modules, a control circuit, and a driver module.

Each LED module includes a package housing for multiple LED regions. The multiple LED regions share the package housing but are covered with different fluorescent layers for emitting lights with different optical characteristics.

LED regions uses the same LED chip. The LED chip has multiple sub-areas distributed respectively in the multiple LED regions. For example, the LED chip is placed at the center and has four sub-areas respectively located in four LED regions that are covered with different fluorescent layers.

Figure 15:
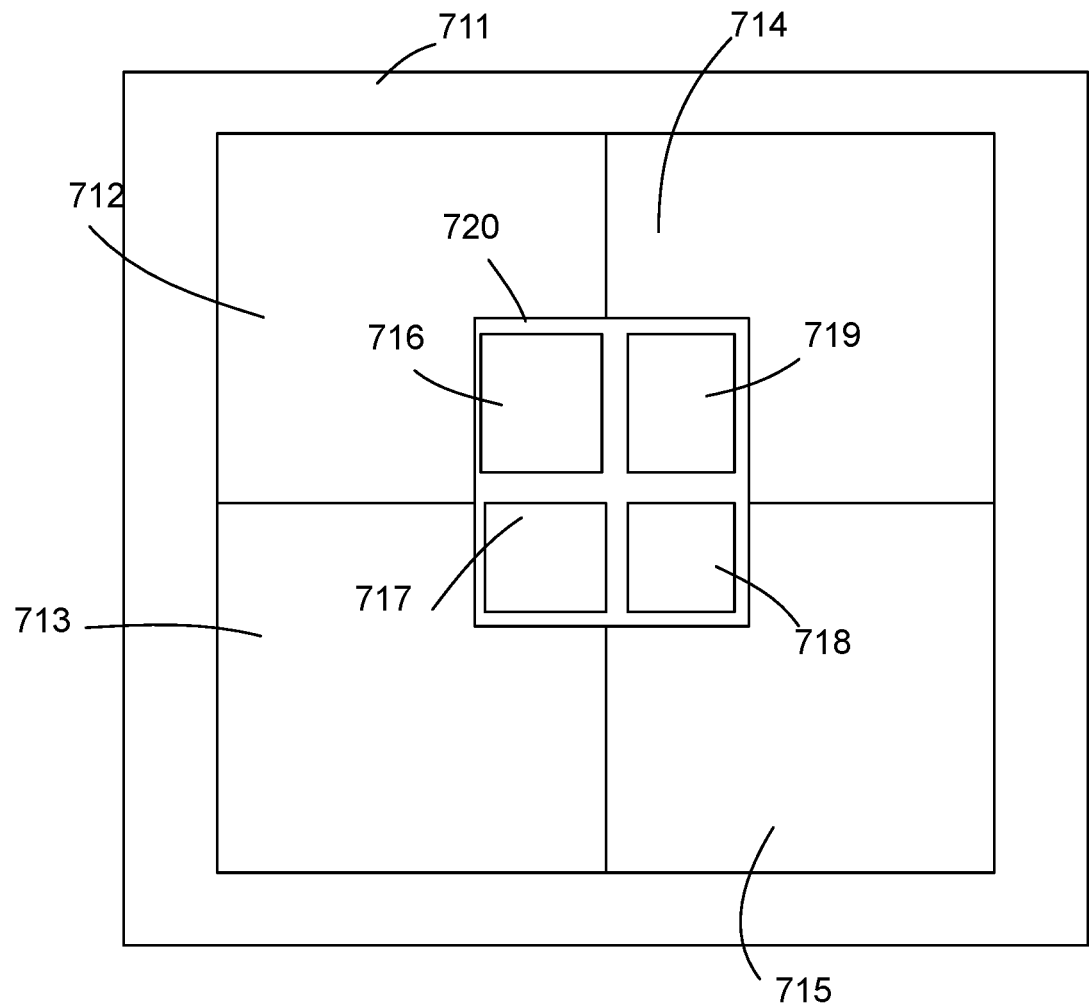
FIG. 15 illustrates another LED module embodiment with a single LED chip.

Please refer to FIG. 15. In FIG. 15, a LED module 711 has four LED regions 712, 713, 714, 715 but has one LED chip 720. The LED chip 720 have multiple sub-areas 716, 717, 718, 719 respectively located in different LED regions 712, 713, 714, 715 that are covered with different fluorescent layers, thus emitting different output lights as a mixed light.

The light apparatus has multiple LED modules. These LED modules may have the same LED regions, e.g. with the same fluorescent layer composition or etched trench patterns, but are provided with different currents or controlled separately so as to achieve different light effect.

For example, the LED modules are placed on different positions of a filament. By controlling currents to these LED modules separately, these LED modules may emit different light strengths and/or even different LED region light outputs.

Figure 14:
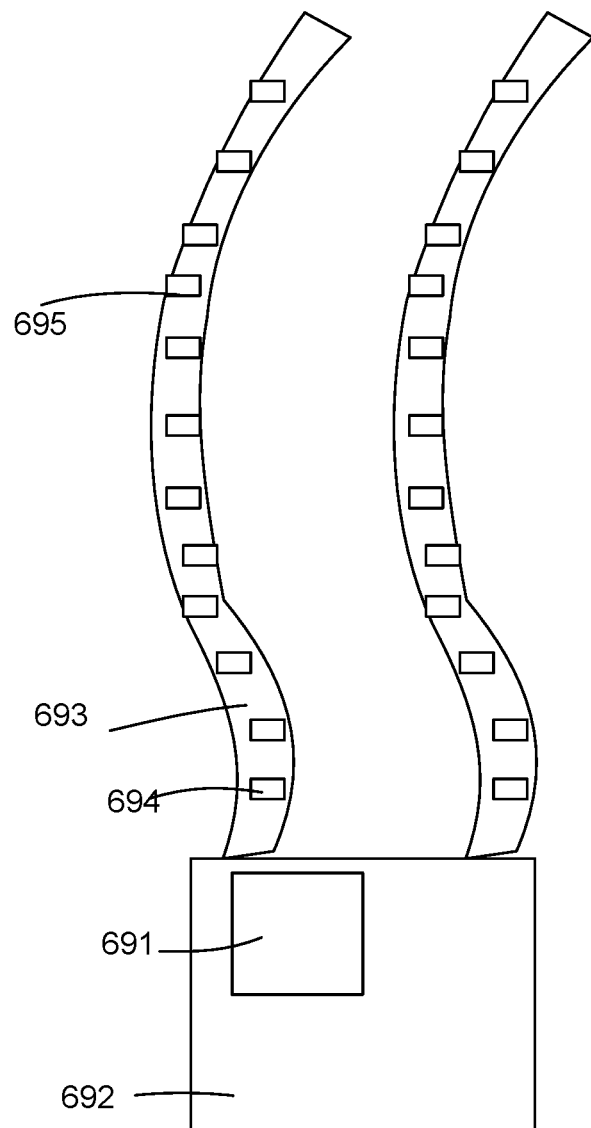
FIG. 14 illustrates another embodiment with multiple LED modules.

Please refer to FIG. 14. In FIG. 14, a light apparatus includes two filaments, i.e. elongated light strips, and each filament 693 is mounted with multiple LED modules 694, 695.

The driver module 692 receives control signals of the control circuit 691 to send different currents to the LED modules 694, 695 separately. By setting the control circuit 691, the two LED modules 694, 695 located at different positions of the filament may emit lights with different strengths. Furthermore, the two LED modules 694, 695, even with the same LED region settings, may emit different mixed light characteristic by sending different sets of current ratios to their LED regions separately.

The driver module is electrically connected to the electrodes of the multiple LED regions and connected to the control circuit for selectively supplying the currents to multiple LED regions of the multiple LED modules.

Figure 13:
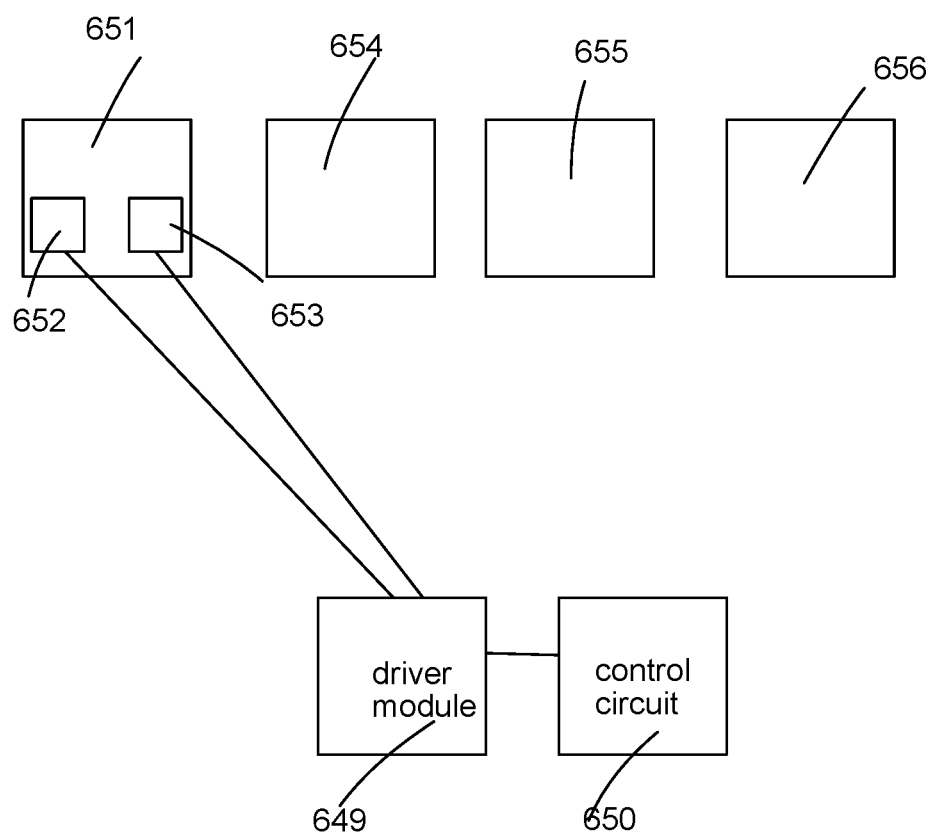
FIG. 13 illustrates component relation.

Please see FIG. 13, which illustrates relation among components in an embodiment.

In FIG. 13, a driver module 649 is connected to a control circuit 650 to receive control signals. The driver module 649 supplies currents to multiple LED modules 651, 654, 655, 656.

The LED module 651 has multiple LED regions 652, 653 receiving currents from the driver module separately so that different LED regions may be controlled separately to emit lights of different strengths.

Figure 10:
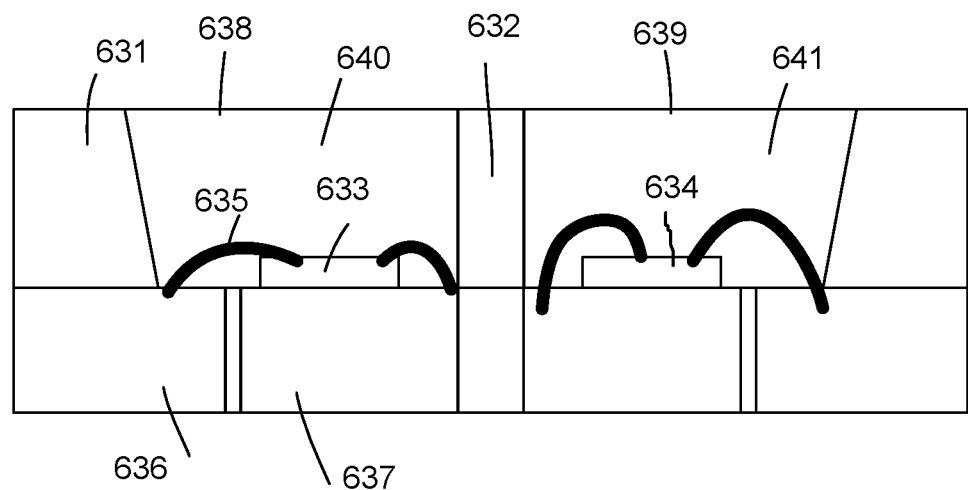
FIG. 10 illustrates a LED module with multiple LED regions sharing the same package housing.
Figure 11:
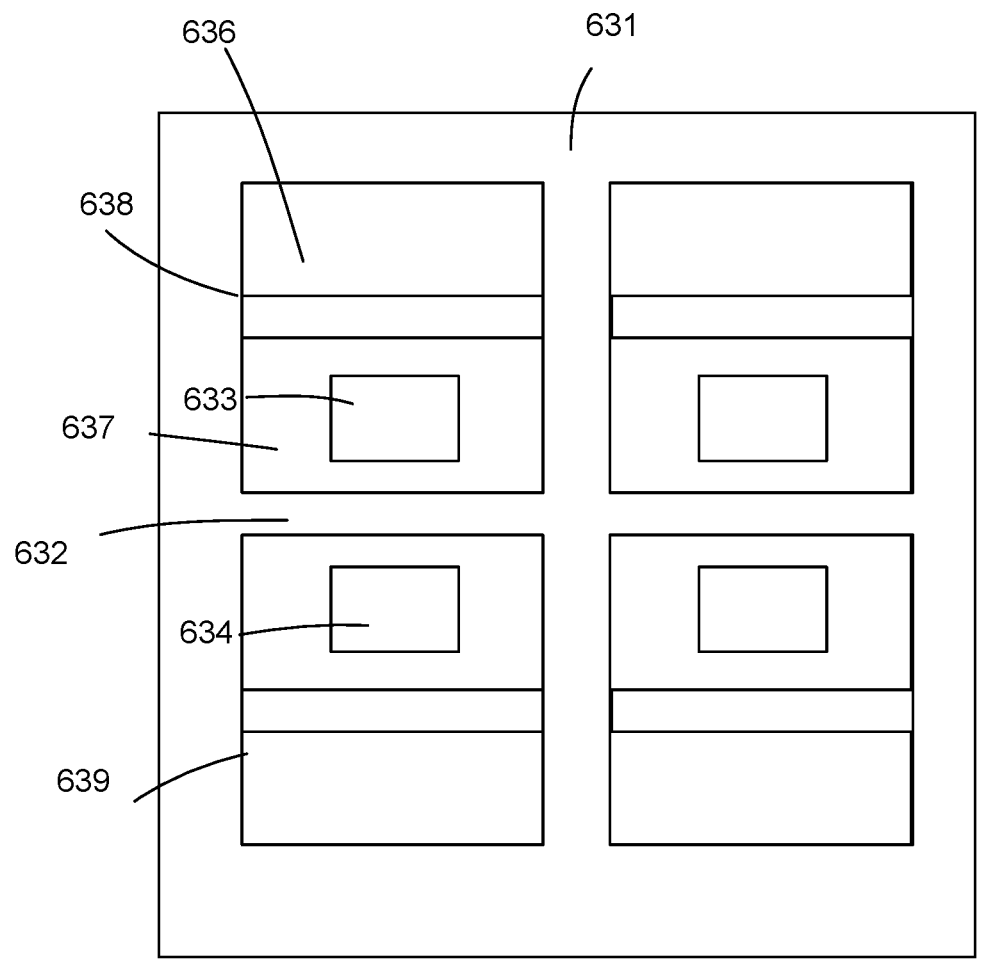
FIG. 11 shows another view of FIG. 10.

Please refer to FIG. 10 and FIG. 11. In FIG. 10, a LED module has multiple LED regions 638, 639. In this example, the LED regions 638, 639 respectively have LED chips 633, 634 and share the same package housing 631. There is a separator wall 632 separating the LED regions 638, 639. Different fluorescent layers 640, 641 are filled in different LED regions 638, 639.

There are wires like the wire 635 for electrically connecting the LED chip 633 to metal electrodes 636, 637.

In some embodiments, the multiple LED regions include a blue light region, a red light region, a green light region and a white light region.

In some embodiments, the multiple LED regions emit lights with different color temperatures. The multiple LED regions emit lights with different color spectrums.

In some embodiments, the multiple LED regions in the LED module are arranged as grids.

In some embodiments, the different LED regions include the same LED chips covered with different first fluorescent layers and a same second fluorescent layer.

In some embodiments, the first fluorescent layers have less area than the second fluorescent layer.

Figure 12:
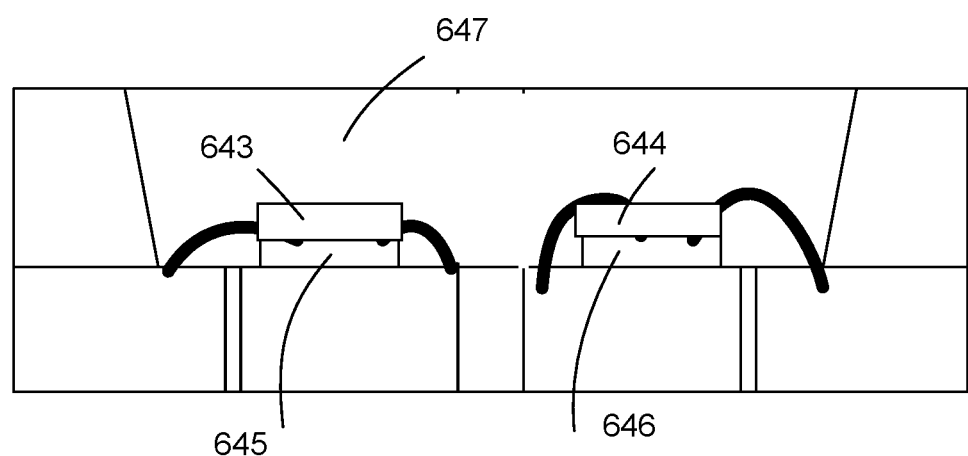
FIG. 12 shows another embodiment with multiple LED regions.

Please refer to FIG. 12. In FIG. 12, two LED regions have two LED chips 645, 646 covered with different first fluorescent layers 643, 644. Upon the different fluorescent layers 643, 644, another second fluorescent layer 647 is covered with larger area size than the first fluorescent layers. With such arrangement, different LED regions may provide different lights to be mixed even they have the same LED chips 645, 646.

In some embodiments, the second fluorescent layer comprise multiple sub-layers stacked one above another.

In some embodiments, the multiple LED regions contain different LED chips.

In some embodiments, the different LED chips are kept with a distance for better heat dissipation.

In some embodiments, at least two of the multiple LED regions are covered with the same fluorescent layer.

Some other features may use the features further mentioned below.

In some embodiments, a light apparatus is designed for generating mixed light output. The light apparatus includes multiple LED modules, a control circuit, and a driver module.

Each LED module includes multiple LED regions. The multiple LED regions have separate electrodes. The multiple LED regions share multiple stacked semiconductor layers but at least two LED regions have different etched trench patterns for emitting lights with different optical characteristics.

The control circuit determines currents supplied to the LED regions separately for generating a mixed light output with requested optical parameters. For example, the control circuit may be connected to an operative switch for receiving a user input or a pre-defined setting.

The driver module is electrically connected to the electrodes of the multiple LED regions and connected to the control circuit for selectively supplying the currents to multiple LED regions of the multiple LED modules. PWM or linear currents may be supplied to the LED regions to generate different light strengths.

Figure 6:
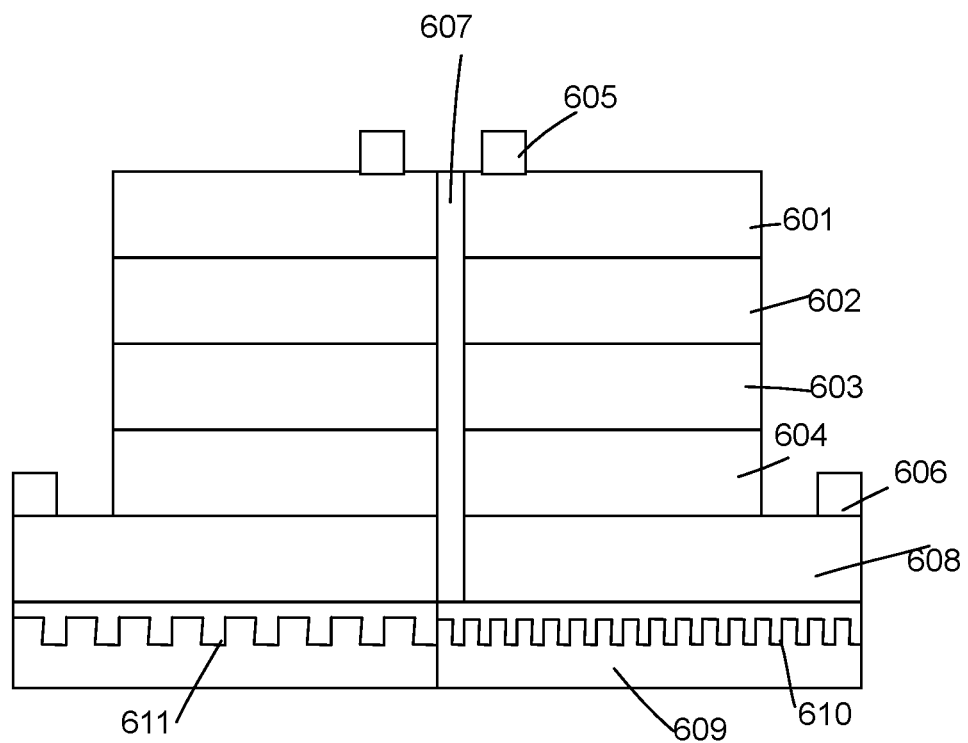
FIG. 6 illustrates a LED module with multiple LED regions.
Figure 7:
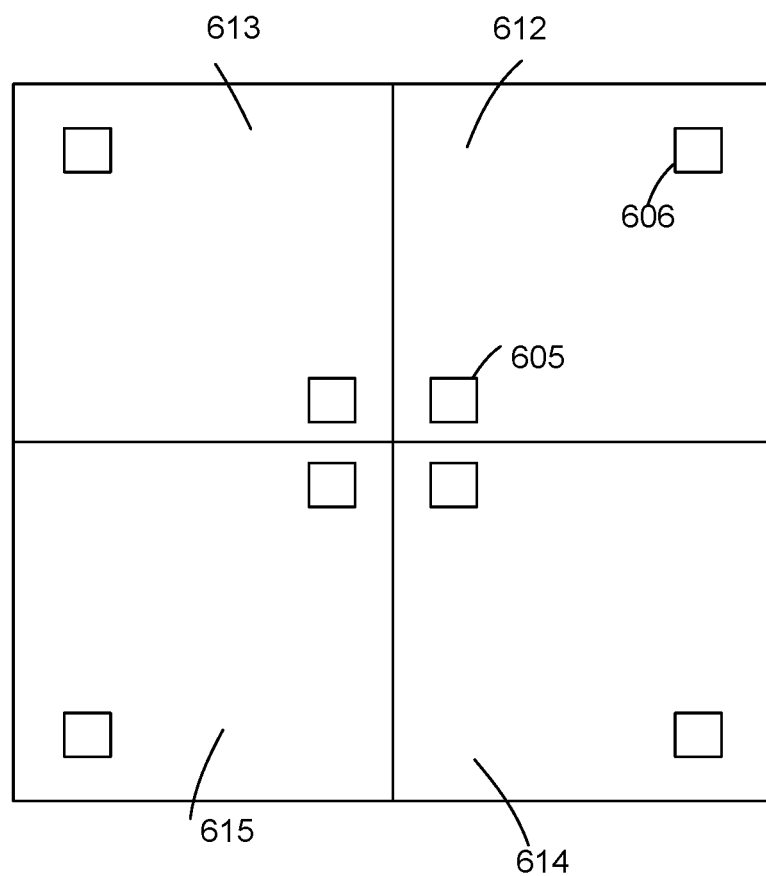
FIG. 7 illustrates another view of FIG. 6.

Please refer to FIG. 6 and FIG. 7. FIG. 6 illustrates an example of such LED module and FIG. 7 shows a top view of FIG. 6.

In this example, the LED module has four LED regions 612, 613, 614, 615 arranged as a grid.

In FIG. 6, two LED regions are illustrated in their side view. The two LED regions share multiple semiconductor layers but with different etched trench patterns 610, 611 on a substrate 609 to emit different light outputs. For example, the etched trench patterns 610, 611 have different densities.

The shared semiconductor layers may include a GaN buffer layer 608, a N-type GaN layer 604, a InGaN/GaN layer 603, an electronic shielding layer 602, and a P type GaN layer 601. A P-type electrode 605 and a N-type electrode 606 are used for receiving currents. There may be also an insulation layer 607 between LED regions.

In some embodiments, the multiple LED regions may include a blue light region, a red light region, a green light region and a white light region. With the four light regions, a mixed light is generated by adjusting currents supplied to the four regions. In some other embodiments, the currents may be fixed, instead of being changed dynamically.

In some embodiments, the multiple LED regions emit lights with different color temperatures. By adjusting different current ratios or different PWM duty ratios, the LED module may emit lights of different color temperatures.

In some embodiments, the multiple LED regions emit lights with different color spectrums. For example, different LED regions may emit different colors.

In some embodiments, the multiple LED regions in the LED module are arranged as grids. For example, each LED region is a rectangular area and arranged together as a larger rectangular shape.

In some embodiments, the shared stacked semiconductor layers include a GaN buffer layer, a N-type GaN layer, a InGaN/GaN layer, an electronic shielding layer, and a P type GaN layer, from bottom to top.

In some embodiments, the etched trench patterns have different trench densities for generating output lights of different optical characteristics. By adjusting trench densities, different LED regions emit lights with different optical characteristics. Meanwhile, because the different LED regions may share the same substrate and stacked semiconductor layers, it is easier to manufacture the LED module in the same semiconductor procedure.

In some embodiments, the etched trench patterns are formed on a Lithium aluminate substrate.

In some embodiments, the LED regions are covered with one or more fluorescent layer to change output light characteristics.

In some embodiments, the fluorescent layers covering different LED regions are different for mixing different lights. In other words, different LED regions are covered with different fluorescent layers for further adjusting light outputs.

In some embodiments, the same LED regions in different LED modules are supplied with different current values. Specifically, there are multiple LED modules disposed in the same light apparatus. In such design, even the LED regions with the same etched trench pattern in different LED modules may be supplied with different current values, e.g. depending on where the LED module is disposed in the light apparatus.

In some embodiments, when an overall driving current is decreased, the currents supplied to different LED regions drop at different speeds. In other words, in such design, the overall light output strength may be adjusted by adjusting an overall current strength. When the overall light of the light apparatus is lowered down, the currents dropping speeds are controlled to be different, e.g. so as to simulate some natural light changes from noon to sunset.

In some embodiments, light emitted directions of the multiple LED regions are overlapped partially to generate a better mixed effect. For example, each LED regions are arranged with certain tilt angles in some layers or directed by some layers to overlap the lights from different LED regions.

Figure 9:
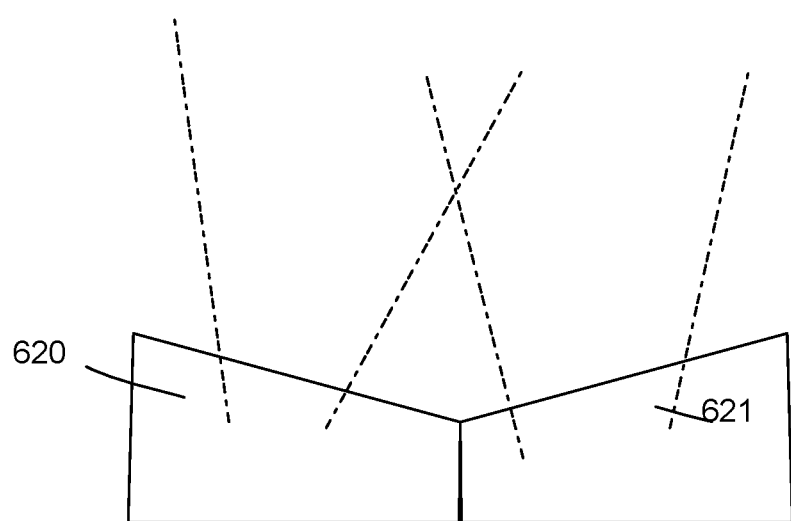
FIG. 9 illustrates LED regions with tilt angles.

Please see FIG. 9. In FIG. 9, two LED regions 620, 621 are tilted with angles so that their output lights are overlapped to provide a better mixed effect.

In some embodiments, the etched trench patterns emit of the multiple LED regions are arranged with a tilt angles for overlapping emitted lights of the multiple LED regions.

In some embodiments, area sizes of the multiple LED regions are not the same. For example, some LED regions provide more lights than other LED regions when they are major light sources.

Figure 8:
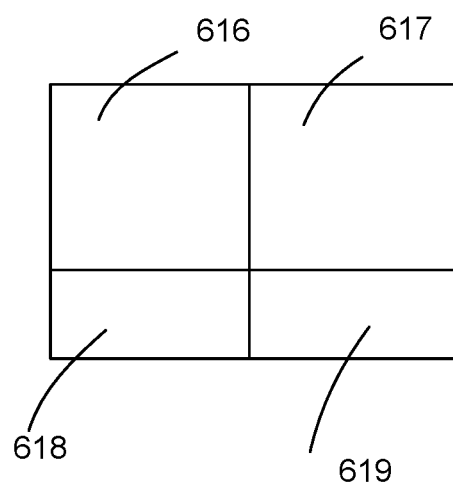
FIG. 8 illustrates a different embodiment of the LED module.

Please see FIG. 8. In FIG. 8, the LED regions 616, 619 have the same etched trench pattern. The LED regions 616, 617, 618, 619 have more than one types of area sizes.

In some embodiments, at least two of the multiple LED regions have the same etched trench pattern. For example, there may be two red regions, one green region and one blue region for emphasizing certain light characteristic.

In some embodiments, the control circuit includes a communication circuit for receiving an external command. The control circuit decodes the external command and translates the external command to corresponding control signals to the driver module to generate associated currents.

In some embodiments, the communication circuit is a wireless circuit. Therefore, the external command may be sent from a mobile phone, a remote control or even a remote server.

In some embodiments, the multiple LED regions are not supplied the currents at the same time. In other words, they are supplied with currents sequentially. This may help simplify circuit design and/or maximize output strength of each LED region, e.g. to keep a current generator circuit of the driver module to generate a constant current supplying to the LED regions one after another in a sequence.

In some embodiments, the LED regions are supplied with the currents sequentially in an adjustable order over time to emit different mixed lights. For example, some LED regions may be supplied with more times in the order to emphasize its output compared with other LED regions.

In an embodiment, a light apparatus includes a white set of LED modules and a non-white set of LED modules. The white set of LED modules include multiple LED modules with more than one type of optical characteristic. For example, the white set of LED modules has a first LED module with a first color temperature that is close to sunrise sunshine. In addition, the white set of LED modules also has a second LED module with a second color temperature that is close to noon time sunshine. Both the first LED module and the second LED module are "white" LED modules although they may have different color temperatures.

The non-white set of LED modules may include LED modules with multiple colors that are not white. For example, the LED modules in the non-white LED set may emit red light, blue light or green light.

The LED modules in the white set of LED modules or the non-white set of LED modules may contain the same LED chips, e.g. blue light LED chips, covered with different fluorescent layers for converting the original light of the LED chips to desired optical characteristic, e.g. white lights with different color temperatures, red light, green light or blue light.

The light apparatus includes a driver circuit for providing a driving current supplying to the white set of LED modules and the non-white set of LED modules. The driver circuit may supply different current to change emitted light strengths of the white set of LED modules and the non-white set of LED modules to blend a mixed overall light of the LED light apparatus. For example, the LED modules of different color temperatures in the white set of LED modules receive different currents to adjust overall color temperature of the white set of LED modules. In the example mentioned above, the first LED module may receive a 0.05 A current and the second LED module may receive a 0.50 A current. The overall color temperature would appear with a 1 to 10 ratio between the color temperatures of the first LED module and second LED module. By changing the current ratio, the overall color temperature may be adjusted to a desired value dynamically. In addition to change the current, the overall mixed light optical characteristic may also be adjusted by other techniques like adjusting duty ratio of the LED module.

In an embodiment, the white set of LED modules and the non-white set of LED modules are categorized into two groups operated in separate modes respectively. Specifically, in such embodiment, the white set of LED modules and the non-white set of LED modules are not operated at the same time for mixing a desired optical characteristic.

For example, the light apparatus may have a first mode and a second mode. In the first mode, the white set of LED modules are turned on while the non-white LED modules are turned off. In the first mode, the LED modules with different color temperatures or other optical characteristic may be adjusted respectively to mix a desired color temperature or other optical characteristic as mentioned above. In the second mode, the non-white set of LED modules are turned on, and the LED modules in the non-white set of LED modules are adjusted separately for mixing a desired color or other optical characteristic. In other words, in such embodiments, the white set of LED modules are not used together with the non-white set of LED modules for mixing a desired optical characteristic. The light apparatus has the white set of LED modules and the non-white set of LED modules at the same time, but the two sets of LED modules are not combined for mixing a desired optical characteristic.

In a white light mode (the first mode mentioned above), the output white light is generated by one or more white LEDs. The white LEDs (the white set of LED modules) can have different color temperatures so that the user can adjust to a specific color temperature by mixing the different white LEDs. None of the R, G, and B LEDs (the non-white set of LED modules) emit light in the white light mode. In other words, the white output light is generated by only mixing light from different white LEDs, not by using any R or G or B LEDs. In one embodiment, Ra8 of the white light mode is always lower than 85.

In a color light mode (the second mode mentioned above), the output color light is generated only by mixing the R, G, and B LEDs. None of the white LEDs emit light in the color light mode. That is, the output color light is generated only by mixing light from the R, G, B LEDs, not by using any of the white LEDs.

Thus, in this case, the whites LEDs and the R, G, B LEDs do not emit light simultaneously.

Figure 1:
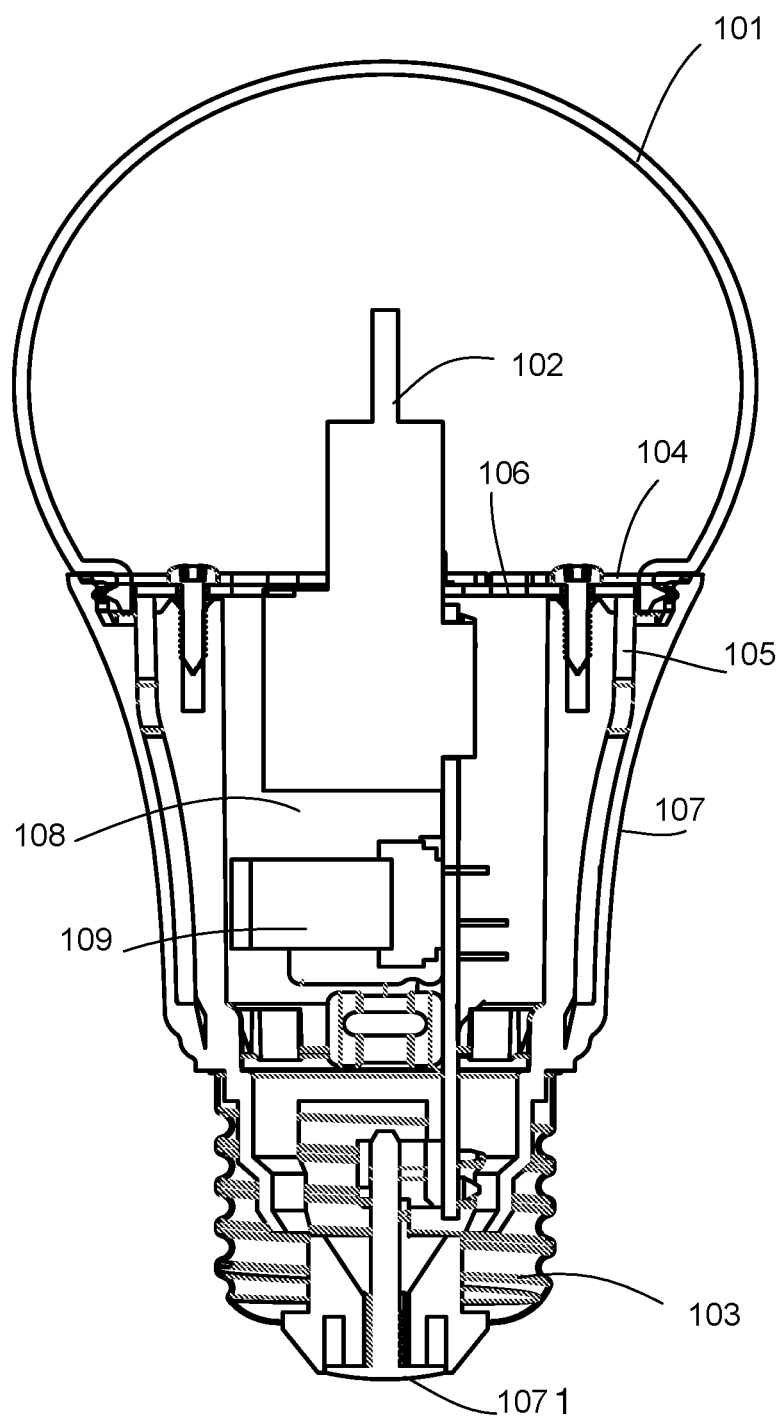
FIG. 1 is a light apparatus embodiment, showing components with a cross-sectional view.
Figure 2:
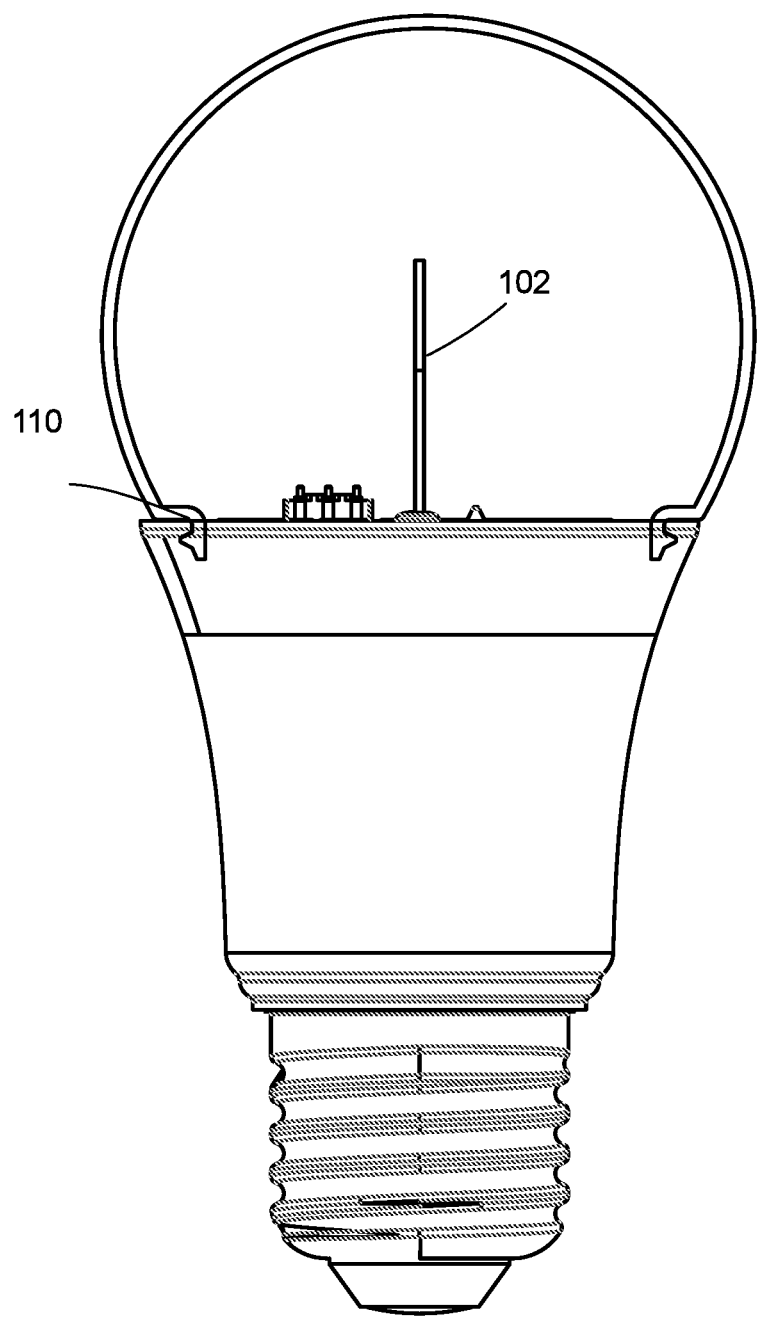
FIG. 2 shows another aspect of FIG. 1.
Figure 3:
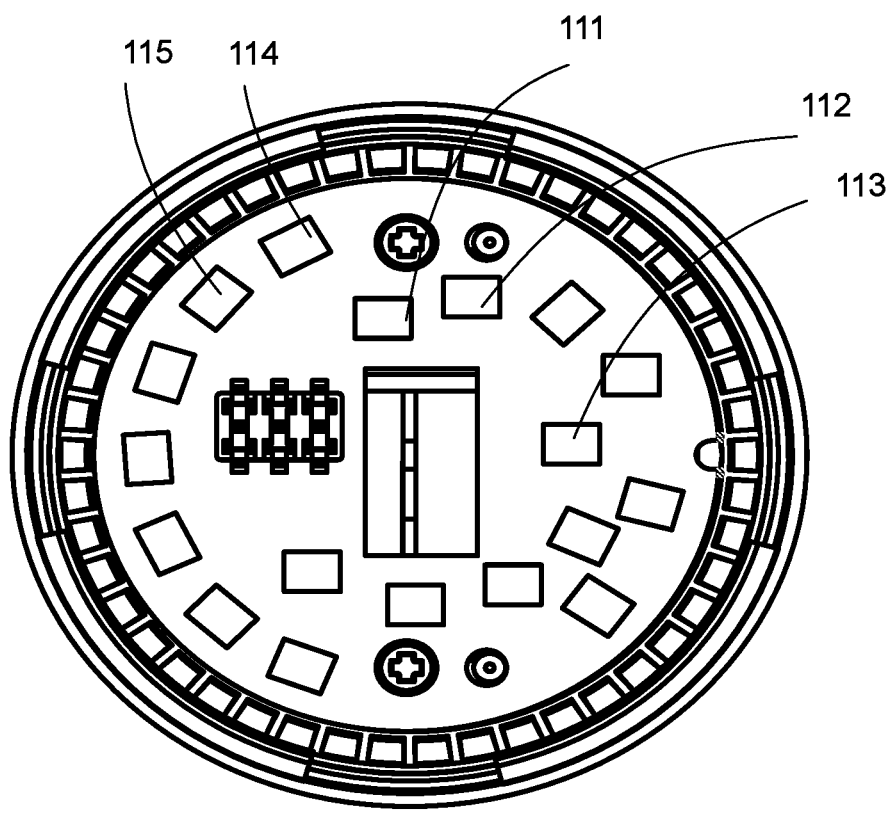
FIG. 3 shows a top view of FIG. 1.

Please refer to FIG. 1, FIG. 2 and FIG. 3, which illustrate an light bulb example implementing the concept mentioned above.

In FIG. 1, a light bulb, as a light apparatus, includes a bulb shell 101, a bulb body housing 107. There is a plugging terminal 1071 inserted to a bottom of the bulb body housing 107. A heat sink component 105 like a metal cup is attached for bringing heat of a light source plate 104 to the bulb body housing 107.

There is a driver circuit board enclosed by the bulb body housing 107. The driver circuit is connected to the plugging terminal 1071 and the cap terminal 103 for receiving an external power source. The driver circuit board is mounted with a driver circuit 109 and a wireless circuit 108. The driver circuit 109 generates one or multiple driving currents by converting the external power source, like 110V or 220V alternating current source.

The wireless circuit 108 is used for receiving and/or sending a status to an external device like a mobile phone or a remote control. The commands from the external device may indicate the driver circuit 109 to change current or duty ratio to a white set of LED components and a non-white set of LED components.

The light source plate 104 mounted with the LED modules has a pluggable socket 106 for receiving a pin of the driver circuit board for supplying electricity to the LED modules on the light source plate 104. By using the pluggable socket 106, welding may be replaced with an easier assembling structure. The wireless circuit 108 may implement one or multiple wireless protocols like Wi-Fi, Bluetooth, Zigbee, Z-wave and an antenna 102 is protruding upwardly for transmitting and/or receiving signal for the wireless circuit 108. 1

In FIG. 2, the bulb shell has an elastic hook 110 to be connected to the bulb body housing, which may strengthen the structure of the light apparatus.

In FIG. 3, there is a white set of LED modules and a non-white set of LED modules. The white set of LED modules include a first white LED module 114 and a second white LED module 115. The first white LED module 114 and the second white LED module 115 are both white LED modules but have different color temperatures. As mentioned above, in a first mode, the first white LED module 114 and the second white LED module 115 may be adjusted for mixing a desired color temperature.

The non-white set of LED modules has a red LED module 111, a green LED module 112, a blue LED module 113. By adjusting current or duty ratio of the red LED module 111, the green LED module 112 and the blue LED module 113, the light apparatus may emit different light colors in the second mode.

Figure 4:
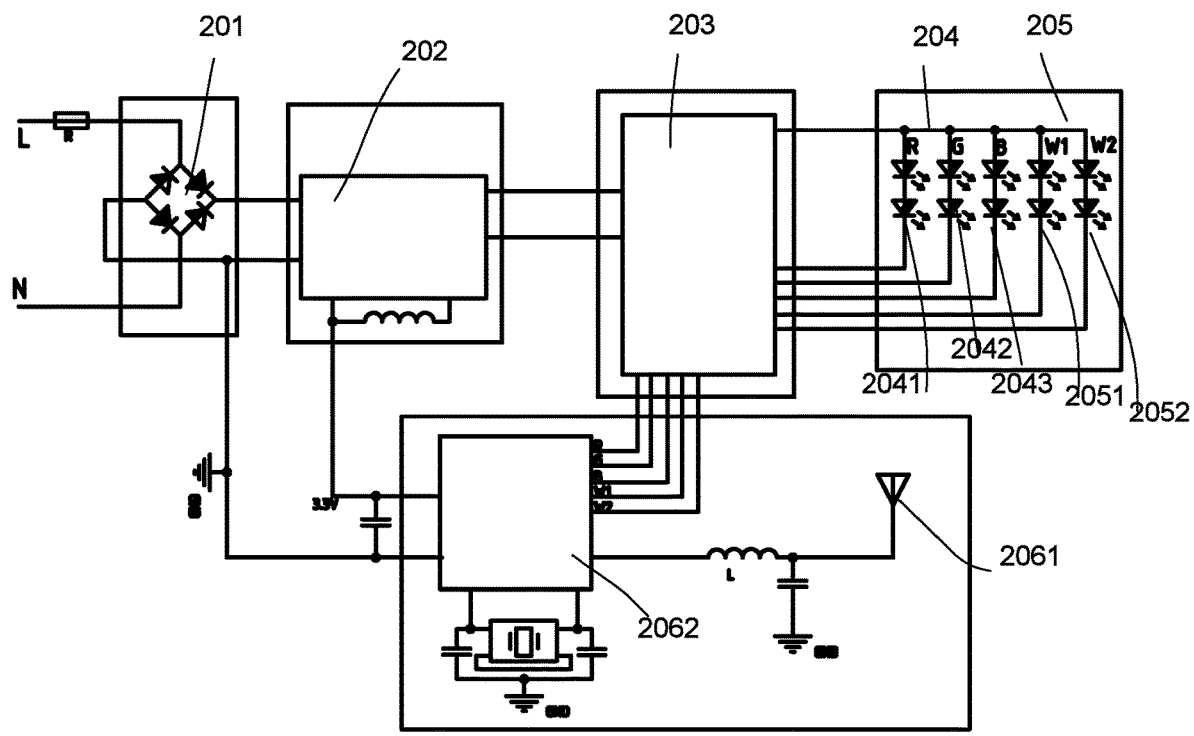
FIG. 4 is a first example of circuit diagram in an embodiment.

In FIG. 4, an illustrative circuit diagram is provided for explaining how to implement the driver circuit.

In FIG. 4, the driver circuit has a bridge circuit 201 for filtering an AC current. A DC to AC converter 202 is used for generating a stable DC current supplying to a wireless circuit 2062 and a driver chip 203. The wireless circuit 2062 is connected to an antenna 2061 for receiving an external command. The driver chip 203 receives the DC current may be controlled by a manual switch, a default setting, or the external command received by the wireless circuit 2062 for generating separate driving currents respectively to a white set of LED components 205 and a non-white set of LED components 204. The white set of LED components 205 may have a first white LED component 2051 and a second white LED component 2052 with different color temperatures. The non-white set of LED components 204 may include a red LED component 2041, a green LED component 2042, a blue LED component 2043.

There are multiple ways to implement the circuit. For example, FIG. 5 illustrate another circuit design.

Figure 5:
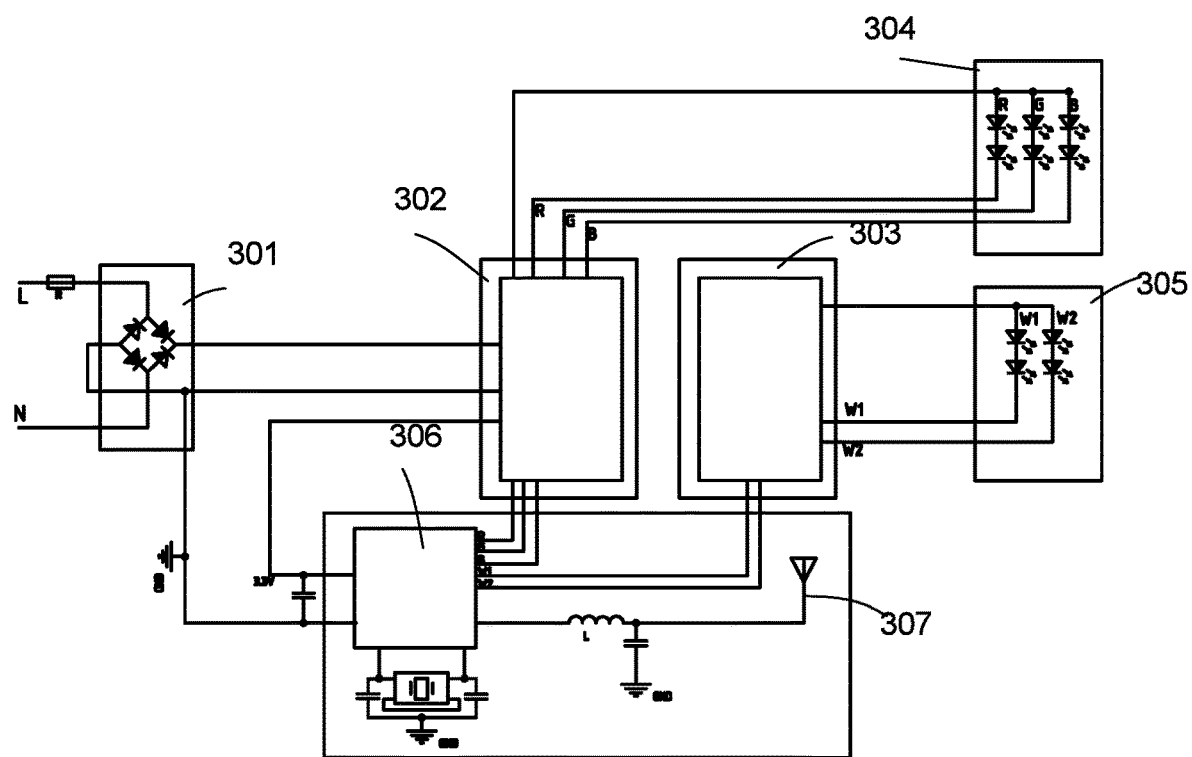
FIG. 5 is a second example of circuit diagram in an embodiment.

In FIG. 5, the bridge circuit 301 filters an AC current. There are two AC-DC converters 302, 303 respectively supplying power to a white set of LED components 304 and a non-white set of LED components 305. The wireless circuit 306 receives signals from an antenna 307. The signals may include an external command for changing the currents of the AC-DC converters 302, 303 for changing color temperatures or colors as mentioned above in the first mode or the second mode.

In some embodiments, a light apparatus includes a white set of LED (Light Emitted Diode) modules and a non-white set of LED modules. The white set of LED modules may include two or more than two LED modules. Each LED module may have one or more than one LED component, e.g. a packaged LED IC covered with fluorescent layer for emitting a light when receiving a driving current. There are more than two types of LED modules that emit different white lights, e.g. with different color temperatures, in the white set of LED modules.

The non-white set of LED modules may include two or more than two LED modules. Each LED module may have one or more than one LED component, e.g. a packaged LED IC covered with fluorescent layer for emitting a light when receiving a driving current. There are more than two types of LED modules that emit different lights, e.g. with different colors, in the non-white set of LED modules.

For example, the white set of LED modules has a first LED module and a second LED module. The first LED module emits a first light with a first color temperature and the second LED module emits a second light with a second color temperature. The first color temperature is different from the second color temperature. For example, the first LED module may emit a light with similar spectrum as sunrise white light, and the second LED module may emit a light with similar spectrum as noon white light.

For example, the non-white set of LED modules includes a third LED module and a fourth LED module. The third LED module emits a third light with a third color and the fourth LED module emits a fourth light with a fourth color. The third color is different from the fourth color. There may be a fifth LED module so that the third LED module, the fourth LED module and the fifth LED module emit red color, blue color and green color, respectively. By adjusting light strengths of non-white set of LED modules, a desired color may be mixed.

The light apparatus also has a control circuit for indicating an operation mode selected from at least a first mode and a second mode. The control circuit, for example, may be a digital circuit or integrated with a mechanic device for storing a status. Users may adjust a manual switch, operate a remote control for setting or adjusting the control circuit for indicating a different operation mode that may be selected from a first mode, a second mode and/or other modes.

A driver module is connected to the control circuit for selectively supplying currents to the first LED module, the second LED module, the third LED module, and the fourth LED module according to the operation mode. The driver module may include a current source, a PWM power circuit or other driver circuit types, for converting 110V or 220V AC to corresponding DC currents supplying to drive the white set of LED modules and the non-white set of LED modules. There may be multiple sub-modules in the driver module respectively for each LED module or for the white set and the for the non-white set of LED modules, respectively.

In the first mode, the first LED module and the second LED module are activated and the third LED module and the fourth LED module are deactivated for mixing a first output light using the first LED module and the second LED module. For example, no current is supplied to the non-white set of LED modules in the first mode. The first LED module and the second LED module are supplied with different currents to obtain different first output lights with different color temperatures.

In the second mode, the first LED and the second LED module are deactivated and the third LED module and the fourth LED module are activated for mixing a second output light using the third LED module and the fourth LED module. For example, the first LED module and the second LED module are turned off. The third LED module, the fourth LED module and maybe other LED module in the non-white set of LED modules are turned on to mix a desired color.

In some embodiments, the first output light is adjusted to a different color temperature by adjusting light strengths of the first LED module and the second LED module.

In some embodiments, the different color temperature of the first output light is obtained by changing a first current ratio of currents supplying to the first LED module and the second LED module.

In some embodiments, the different color temperature of the first output light is obtained by changing duty ratios of the first LED module and the second LED light module. In PWM power supplying, there is a duty ratio, the turned-on to turned-off ratio in a quickly repeated cycle, in PWM current supply. By adjusting the duty ratio, the overall output light strength is obtained. By adjusting the relative duty ratio between the first LED module and the second LED module, a different color temperature may be mixed.

In some embodiments, the first LED module and the second LED module emit lights simulating black body radiation spectrums corresponding to different sun light times. Black body radiation spectrum is used in Physics, for indicating light characteristics similar to sun light features.

In some embodiments, the non-white set of LED modules also includes a fifth LED module. The third LED module emits a red light, the fourth LED module emits a green light and the fifth LED module emits a blue light. The second output light is adjusted to have different colors by changing a output ratio of the third LED module, the fourth LED module and the fifth LED module.

In some embodiments, there is a wireless circuit connected to the control circuit for choosing the operation mode from the first mode and the second mode. The wireless circuit may implement Wi-Fi, Bluetooth, or other wireless protocols for receiving and/or transmitting signals to an external device like a mobile phone or a remote control.

In some embodiments, the wireless circuit also receives an external command for adjusting the first output light and the second output light. The external command may indicate a desired color temperature, a desired color, or a overall light strength for a luminance level.

In some embodiments, there is a manual switch manually operated by a user for indicating the control circuit to choose the operation mode from the first mode and the second mode. For example, the manual switch may be installed on a wall, on a back side of the light apparatus, on a remote control or on other places for users to operate for setting the light apparatus. The manual switch may be a button, a rotating switch, a touch panel, a jumper switch or other forms. The control circuit may receive the status of the manual switch and translate the status to choose a corresponding operation mode or other parameters.

For example, a light bulb as an example may be disposed with a manual switch near its bulb cap. Users may buy the same light bulb but switch the manual switch to set the output light of the light bulb to a desired color temperature or a desired color. This may decrease the storage in the store and users may even change the setting when they want to do so. Such mechanism may also be applied to down light, panel light, spot light or other light devices.

In some embodiments, the manual switch is concealed from direct user touch after installation of the light apparatus.

In some embodiments, the driver circuit has a shared current circuit for supplying a driving current to either the white set of LED modules or the non-white set of LED modules. As mentioned above, since the white set of LED module and the non-white set of LED modules may be set not turning on at the same time, there may be a shared current source supplying a common current source either supplying to the white set of LED modules or the non-white set of LED modules. In other words, in such design, there may be two sets of LED modules, but there may be only one set of driver circuit. Since the cost of LED modules are decreasing, the overall value of such design keeps increasing.

In some embodiments, the shared circuit switches the driving current to either the white set of LED modules or the non-white set of LED modules based on the operation mode.

In some embodiments, the driver module adjusts the first output light by changing duty ratios of the first LED module and the second LED module via PWM power supplying.

In some embodiments, the driver module adjusts the second output light by changing current ratios of the third LED module and the fourth LED module.

In some embodiments, the driver module activates both the white set of LED modules and the non-white set of LED modules in a third mode for generating a third output light.

In some embodiments, the driver module activates both the white set of LED modules and the non-white set of LED modules in a third mode for generating a third output light.

In some embodiments, a mixed color of the third output light is changed by adjusting the non-white set of LED modules.

In some embodiments, a mixed color temperature of the third output light is changed by adjusting the white set of LED modules.

In some embodiments, the white set of LED modules and the non-white set of LED modules are placed in an alternating mixed manner. Specifically, there may be multiple LED modules in the white set of LED modules and the non-white set of LED modules. To mix a better output light, the multiple LED modules may be disposed in an alternating mixed manner, e.g. different types of LED modules are placed next to each other while the same types of LED modules are distributed evenly on a light source plate.

In addition, since the first mode and the second mode determine that the white set of LED modules and the non-white set of LED modules are not turned on at the same time, one LED module of the white set of LED modules may be placed adjacent to one LED module of the non-white set of LED modules for achieving better heat dissipation, i.e. heat not accumulated at the same place.

In some embodiments, the control circuit switches to the first mode or the second mode when the white set of LED modules or the non-white set of LED modules are damaged.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A light apparatus with mixed light output, comprising:
   multiple LED modules, each LED module comprising a package housing for multiple LED regions, the multiple LED regions having a LED chip with multiple sub-areas distributed respectively in a center of the multiple LED regions, the multiple LED regions sharing the package housing for emitting lights with different optical characteristics; wherein area sizes of the multiple sub-areas are not the same;
   a control circuit for determining currents supplied to the multiple LED modules; and
   a driver module for electrically connecting to electrodes of the multiple LED regions and connecting to the control circuit for selectively supplying the determined currents to the multiple LED modules, wherein different LED regions comprise the LED chip covered with different first fluorescent layers and a same second fluorescent layer contacting and upon the different first fluorescent layers.

2. The light apparatus of claim 1, wherein the multiple LED regions comprise a blue light region, a red light region, a green light region and a white light region.

3. The light apparatus of claim 1, wherein the multiple LED regions emit said lights with different color temperatures.

4. The light apparatus of claim 1, wherein the multiple LED regions emit said lights with different color spectrums.

5. The light apparatus of claim 1, wherein the multiple LED regions in said each LED module are arranged as grids.

6. The light apparatus of claim 1, wherein the different first fluorescent layers have less area than the same second fluorescent layer.

7. The light apparatus of claim 6, wherein the same second fluorescent layer comprise multiple sub-layers stacked one above another.

8. The light apparatus of claim 1, wherein the multiple LED regions contain different LED chips.

9. The light apparatus of claim 8, wherein the different LED chips are kept with a distance.

10. The light apparatus of claim 1, wherein same LED regions in different LED modules are supplied with different current values.

11. The light apparatus of claim 1, wherein when an overall driving current is decreased, the determined currents supplied to the different LED regions drop at different speeds.

12. The light apparatus of claim 1, wherein light emitted directions of the multiple LED regions are overlapped partially.

13. The light apparatus of claim 1, wherein the different first fluorescent layers and the same second fluorescent layer of the multiple LED regions are arranged with tilt angles for overlapping said emitted lights of the multiple LED regions.

14. The light apparatus of claim 1, wherein at least two of the multiple LED regions are covered with the same second fluorescent layer.

15. The light apparatus of claim 1, wherein the control circuit comprises a communication circuit for receiving an external command.

16. The light apparatus of claim 15, wherein the communication circuit is a wireless circuit.

17. The light apparatus of claim 1, wherein the multiple LED regions are not supplied with the determined currents at the same time.

18. The light apparatus of claim 17, wherein the multiple LED regions are supplied with the determined currents sequentially in an adjustable order over time to emit different mixed lights.

* * * * *